(12) United States Patent
Kato et al.

(10) Patent No.: US 6,590,670 B1
(45) Date of Patent: Jul. 8, 2003

(54) METHOD AND APPARATUS FOR MEASURING HEIGHTS OF TEST PARTS OF OBJECT TO BE MEASURED

(75) Inventors: Akiharu Kato, Mooka (JP); Sadao Fukuda, Mooka (JP)

(73) Assignee: Tsukuba Seiko Ltd., Mooka (JP)

( * ) Notice: Subject to any disclaimer, the term of this patent is extended or adjusted under 35 U.S.C. 154(b) by 0 days.

(21) Appl. No.: 09/519,354

(22) Filed: Mar. 6, 2000

Related U.S. Application Data

(63) Continuation-in-part of application No. 09/180,506, filed as application No. PCT/JP97/00801 on Mar. 13, 1997, now abandoned.

(51) Int. Cl.$^7$ .............................................. G01B 11/24
(52) U.S. Cl. ...................................................... 356/609
(58) Field of Search ................................ 356/609, 624

(56) References Cited

U.S. PATENT DOCUMENTS

| | | | | |
|---|---|---|---|---|
| 4,689,491 A | * | 8/1987 | Lindow et al. | 356/445 |
| 4,942,618 A | * | 7/1990 | Sumi et al. | 356/376 |
| 5,621,218 A | * | 4/1997 | Tanaka | 356/622 |
| 5,808,746 A | * | 9/1998 | Koishi et al. | 356/445 |

FOREIGN PATENT DOCUMENTS

| | | |
|---|---|---|
| JP | 4-15507 | 1/1992 |
| JP | 4-148544 | 5/1992 |
| JP | 8-334317 | 12/1996 |

* cited by examiner

Primary Examiner—Richard A. Rosenberger
(74) Attorney, Agent, or Firm—Jacobson Holman PLLC

(57) ABSTRACT

A method for measuring the heights of test parts of an object to be measured and a height-measuring apparatus for carrying out the same, comprising the steps of placing an object on an X-Y table, projecting measurement light flux emitted by a light source on the object supported on the X-Y table from above the object with the measurement light flux being focused in a spot beam by an objective lens on the object, receiving the measurement light flux focused in the spot beam on and reflected from the object to be measured to cause a photosensor to detect the condition of focus on the object to be measured of the measurement light flux focused by the objective lens, moving the light source and the objective lens for horizontal scanning movement relative to the X-Y table while the objective leans is reciprocated vertically at a high speed, and determining the height of each of bonding wires on the basis of the vertical position of the objective lens when the measurement light flux is focused on the bonding wire of the object to be measured by the objective lens.

12 Claims, 9 Drawing Sheets

METHOD AND APPARATUS FOR MEASURING HEIGHTS OF TEST PARTS OF OBJECT TO BE MEASURED

This is a continuation-in-part of application Ser. No. 09/180,506, filed Feb. 3, 1999 now abandoned also filed as application No. PCT/JP97/00801 filed Mar. 13, 1997.

BACKGROUND OF THE INVENTION

1. Field of the Invention

The present invention relates to a method for measuring the respective heights of test parts, such as bonding wires, connected to a peripheral part of an object to be measured, such as an IC chip, and intervals between the wires, and a height-measuring apparatus for carrying out the method.

2. Description of the Prior Art

As shown in FIG. 12, an IC chip 6 bonded onto a lead frame 7 with an adhesive 9 is connected to other lead frames 7 with a plurality of bonding wires 8.

A wire-bonding operation for the connection of the bonding wires 8 is achieved by a wire-bonding apparatus. Wire-bonding conditions such as welded parts including balls 8a and crescents 8b, and the heights of the bonding wires 8 and intervals between the bonding wires 8 were visually inspected by using a magnifying glass or a microscope. Standard values for visual inspection are determined on the basis of the results of existence or non-existence of any failure of wire connection after the next resin molding process, and then the practical production of IC chips is started.

SUMMARY OF THE INVENTION

Since it is difficult to inspect the heights of three-dimensionally extended bonding wires by visual observation, it sometimes occurs that IC chips with defective connections are delivered to the next resin-molding process. If IC chips with defective connections are delivered to the resin-molding process, the bonding wires are broken by the flow of resin or the adjacent bonding wires are shorted in the resin-molding process, which results in production of defective IC chips.

Accordingly, it is a principal object of the present invention to provide a height-measuring method and a height-measuring apparatus capable of accurately and quickly measuring the heights of test parts and intervals between the test parts, which are difficult to measure through visual inspection.

Another object of the present invention is to provide a height-measuring method and a height-measuring apparatus capable of simply and accurately measuring the heights of test parts and intervals between the test parts, which are difficult to measure through visual inspection, to find and sort out defective objects at an early stage before a resin molding process.

To achieve the objects, there is provided a method for measuring a height of a test part of an object to be measured, including the steps of placing the object on a table, projecting a spot beam of a measurement light flux to the object on the table from an upper direction of the object, receiving a reflected light of the spot beam reflected by the object with a photosensor to detect a focused state of the measurement light flux on the object, driving the light source and the optical member relatively to the table in a way of scanning in a horizontal direction while reciprocating the optical member vertically at a high speed, and determining the height of the test part on the basis of a vertical position of the optical member when the measurement light flux is focused on the test part by the optical member.

Furthermore, there is provided an apparatus for measuring a height of a test part of an object to be measured, including a table on which the object is placed, a light source for emitting a light flux for measurement, a first optical system having an optical member for focusing, a first sensor for detecting a position of the optical member along the optical axis, a second sensor for receiving a reflected light of the light flux from the object, a second optical system for guiding the reflected light to the second sensor through the optical member, a case for housing the light source, the first optical system, the second sensor and the second optical system, a device for moving the optical axis relatively to the object by moving the case and the object relatively to each other at least in a horizontal direction, and an arithmetic control circuit for determining the height of the first optical system when the light flux is focused on the test part on the basis of a first detection signal output by the first sensor.

DESCRIPTION OF THE PREFERRED EMBODIMENTS

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

A height-measuring apparatus in a preferred embodiment according to the present invention for measuring the respective heights of bonding wires will be described with reference to the accompanying drawings.

[Constitution]

Figure 1:
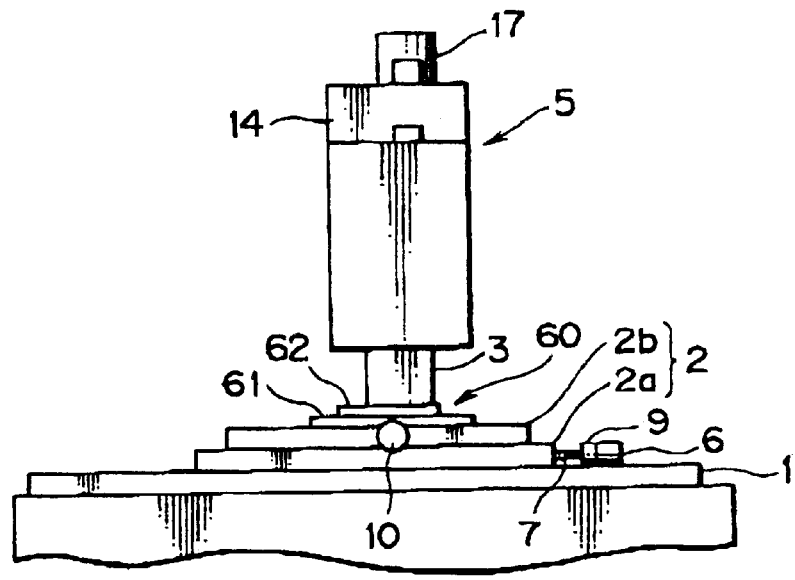
FIG. 1 is a front elevation of a height-measuring apparatus in a preferred embodiment according to the present invention.
Figure 2:
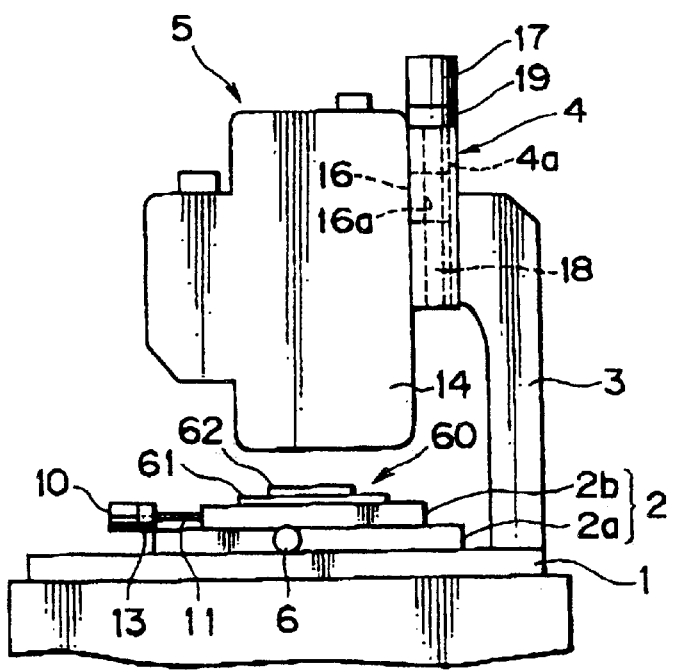
FIG. 2 is a right side elevation of the height-measuring apparatus shown in FIG. 1.

Referring to FIG. 1, the height-measuring apparatus in accordance with the present invention for measuring the respective heights of bonding wires comprises a fixed base 1, an X-Y table 2 mounted on the fixed base 1, and a column 3 fixedly set up on the fixed base 1. As shown in FIG. 2, the height-measuring apparatus has a vertically extended optical-unit-holding member 4 attached to an upper portion of the column 3, and an optical unit 5 attached to the optical-unit-holding member 4. The optical-unit-holding member 4 is provided with a guide groove 4a extending in the vertical direction.

<X-Y table>

The X-Y table 2 has an X table 2a mounted on the fixed base 1 so as to be movable along the X direction (to the right and the left as viewed in FIG. 1) and a Y table 2b mounted on the X table 2a so as to be movable along the Y direction (in directions perpendicular to the paper as viewed in FIG. 1 and to the right and the left as viewed in FIG. 2).

Figure 5:
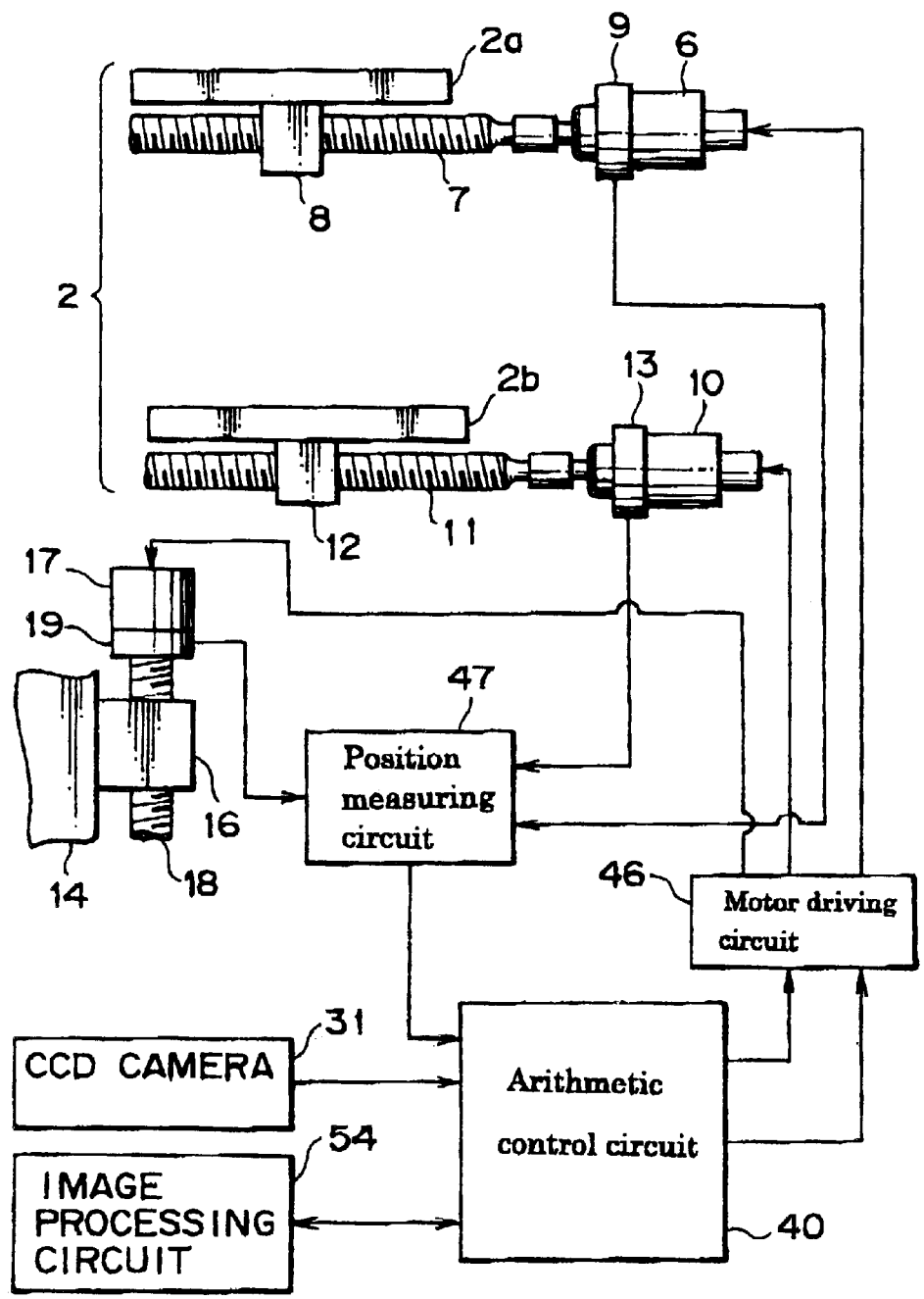
FIG. 5 is an explanatory view of an X-Y table drive control system.

As shown in FIGS. 1 and 5, an X drive motor 6, an axis of which is extending in the X direction, is fixedly mounted on the fixed base 1, and an X feed screw 7 associated with the X drive motor 6 is disposed with its axis extending in the X direction and supported for rotation on the fixed base 1. The X feed screw 7 is in engagement with a nut 8 attached to the X table 2a. The X drive motor 6 rotates the X feed screw 7 in the normal or the reverse direction to move the X table 2a in reciprocal directions in the X direction. An X-position detecting sensor 9 measures the position of the X table 2a with respect to the X direction (X-coordinate). The X-position sensor 9 is a rotary encoder or the like.

As shown in FIGS. 2 and 5, a Y drive motor 10, an axis of which is extending in the Y direction is fixedly mounted on the Y table 2b, and a Y feed screw 11 associated with the Y drive motor 10 is disposed with its axis extending in the Y direction and supported in a state of being freely rotatable on the Y table 2b. The Y feed screw 11 is in engagement with a nut 12 attached to the Y table 2b. The Y drive motor 10 rotates the Y feed screw 11 in the normal or the reverse direction to move the Y table 2b in reciprocal directions in the Y direction. A Y-position sensor 13 measures the position of the Y table 2b with respect to the Y direction (Y-coordinate). The Y-position sensor 13 also is a rotary encoder or the like.

<Optical Unit>

Figure 4:
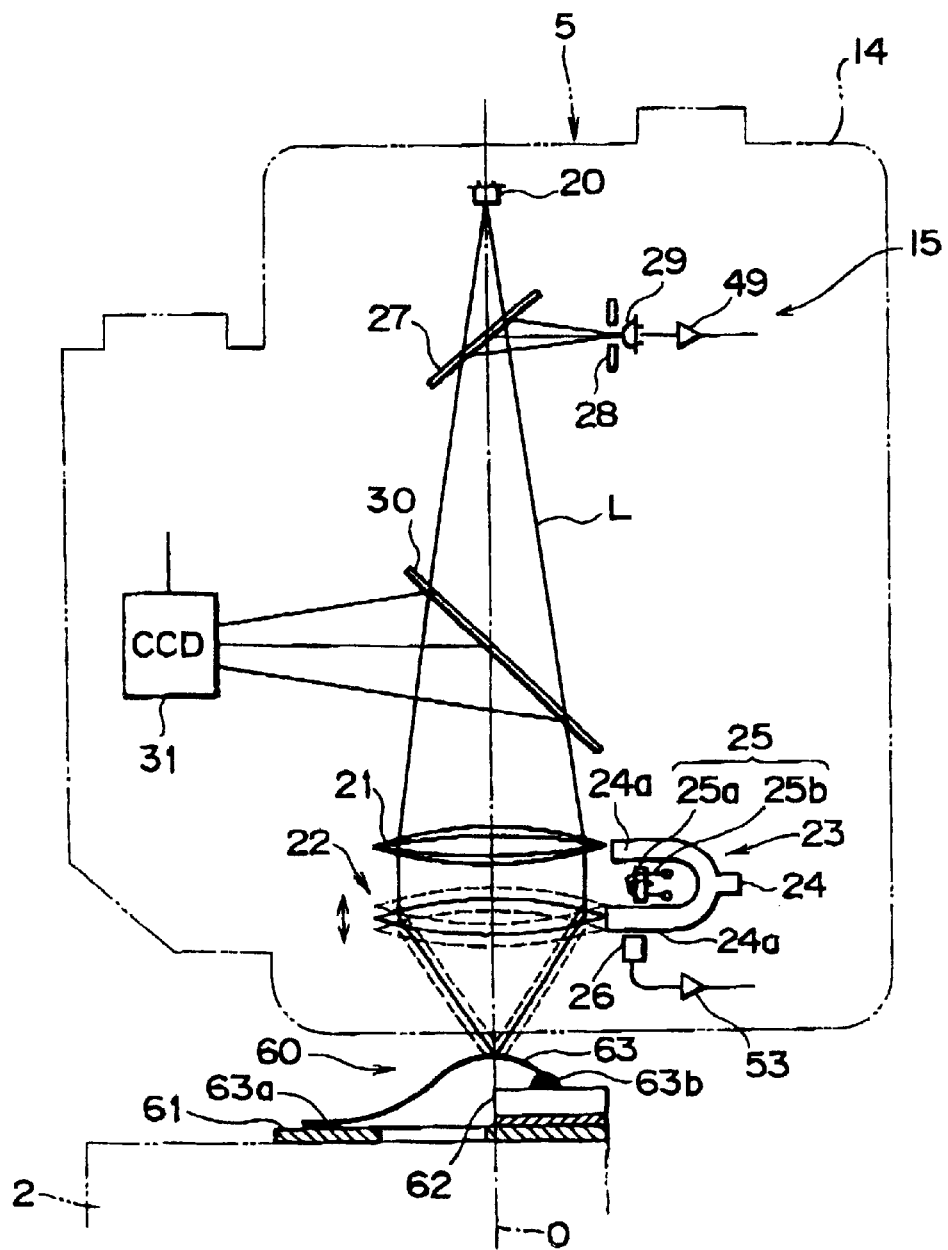
FIG. 4 is a view showing the relation between the object to be measured and a measurement optical system included in the height-measuring apparatus shown in FIG. 1.

As shown in FIG. 4 the optical unit 5 has a case body 14, and a measurement optical system 15 housed in the case body 14.

As shown in FIG. 2, a projection 16 provided with a threaded hole 16a is attached to the back surface of the case body 14. The projection 16 is fitted in a guide groove 4a, formed in the optical unit holding member 4 in a state of being movable in the vertical direction. A Z drive motor 17, an axis of which is extending vertically (direction to the Z-axis), is fixed to the upper end of the optical-unit-holding member 4. A Z feed screw 18 is supported in a state of being freely rotatable on the optical-unit-holding member 4 so as to be associated with the Z drive motor 17 that is extending in the Z-axis direction. The Z feed screw 18 is engaged with the threaded hole 16a of the projection 16. The Z drive motor 17 drives the Z feed screw 18 for rotation in the normal or the reverse direction to move the case body 14 reciprocally in the Z-axis direction. A Z-position detecting sensor 19 measures the position of the case body 14 with respect to the Z direction (Z-coordinate). A rotary encoder or the like is also used as the Z-axis position detecting sensor 19.

The measurement optical system 15 comprises a light source 20 for emitting measurement light flux, such as a laser diode, a measurement-light-flux-projecting optical system for projecting measurement light flux from the light source 20 in a spot beam on an object to be measured, which is placed on the Y table 2b, a focus-detecting optical system for detecting that the measurement light flux projecting optical system has been focused on the object on the Y table 2b, and an optical system for photographing the object supported on the Y table 2b.

<Measurement-Light-Flux-Projecting Optical System>

The measurement-light-flux-projecting optical system comprises a collimation lens 21 for collimating laser light flux (measurement light flux) emitted by the light source 20 in a state of a divergent light flux to a parallel light flux, an objective lens (optical member) 22 for focusing the parallel light flux into a spot beam on the object to be measured, and a lens-reciprocating mechanism 23 as a focus mechanism supporting the objective lens 22 in a state of being vertically movable while vibrating at a predetermined range along an optical axis O of the measurement light flux.

The lens-reciprocating mechanism 23 comprises tuning fork 24 having a base portion held on a bracket or the like, not shown, fixed to the case body 14, and a solenoid device 25 disposed between a pair of prongs 24a of the tuning fork 24 as a reciprocation-generating means. The objective lens 22 is held on the lower one of the pair of prongs 24a. The actuator 25a of the solenoid 25 is attached to the lower prong 24a of the tuning fork 24. Reference character 25b denotes a coil of the solenoid apparatus 25.

A position sensor (first sensor) 26 is disposed below the lower prong 24a to measure the vibration position of the prong 24a in the Z direction (vertical direction). The position-detecting sensor 26 may be an optical distance-measuring device that measures the position of the lower prong 24a by emitting measurement light flux toward the lower prong 24a, receiving the measurement light flux reflected from the lower prong 24a and determining time taken by the reflected measurement light flux to return.

<Focus-detecting Optical System>

The focus-detecting optical system is composed of elements, such as the objective lens 22, the collimation lens 21, a semitransparent mirror 27 disposed between the collimation lens 21 and the light source 20 at an inclination to the optical axis ,O and a pinhole plate 28, distributed in this order. The focus-detecting optical system guides the reflected measurement light flux from the object to be measured, which is placed on the X-Y table 2, to a photosensor 29 (second sensor). When the measurement light flux projecting optical system is focused on the object on the Y table 2b during the vertical vibration of the objective lens 22, a focused point on the object on the Y table 2b and the pinhole of the pinhole plate 28 are substantially conjugate with each other; that is, the focus point of the objective lens 22 on the side of the object and the pinhole of the pinhole plate 28 are conjugate with each other. Since the pinhole plate 28 and the photosensor 29 are disposed very close to each other, the focal point of the objective lens 22 on the side of the object and the photosensor 29 are substantially conjugate with each other.

<Optical System for Photographing>

The optical system for photographing comprises the objective lens 22, the collimation lens 21 and a semitransparent mirror 30 disposed between the collimation lens 21 and the semitransparent mirror 27 at an inclination to the optical axis O. The optical system guides the reflected measurement light flux from the object on the Y table 2b to a CCD camera 31.

<Measurement Control Circuit>

Figure 6:
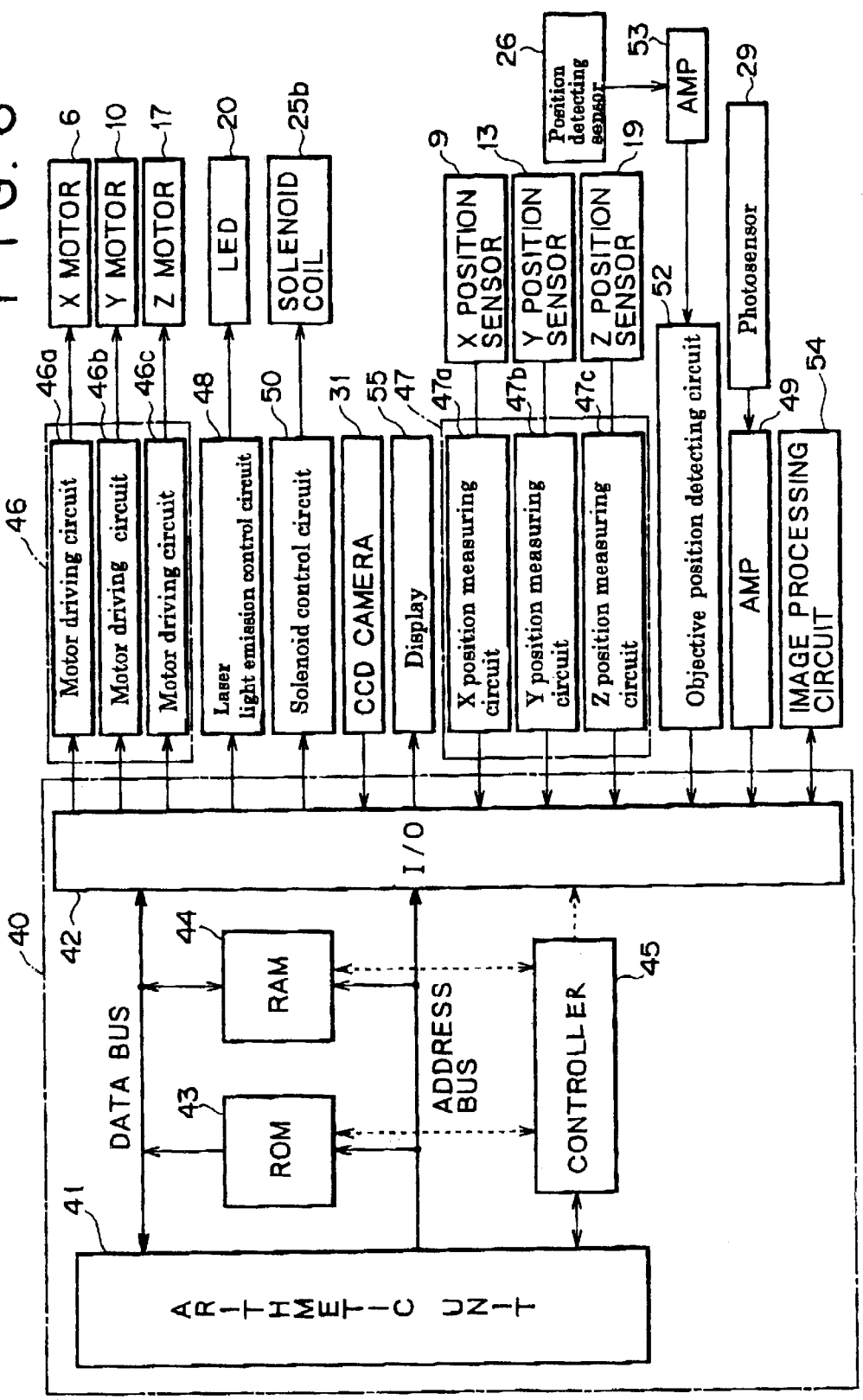
FIG. 6 is a block diagram of a controller included in the height-measuring apparatus.

Operations of the X-Y table 2 and the optical unit 5 stated above are controlled by a measurement control circuit shown in FIG. 6. The measurement control circuit has an arithmetic control circuit 40. The arithmetic control circuit 40 comprises an arithmetic unit 41, such as a CPU, an I/O port 42, a ROM 43 and RAM 44 connected to the arithmetic unit 41 and the I/O port 42 through a data bus and an address bus. The arithmetic control circuit 40 further comprises a controller 45 for controlling the arithmetic unit 41, the I/O port 42, the ROM 43, the RAM 44 and the like.

The X drive motor 6, the Y drive motor 10 and the Z drive motor 17 are connected respectively to the I/O port 42 through a motor driving circuits 46a, 46b and 46c constituting a driver circuit 46.

The X-position-detecting sensor 9, the Y-position-detecting sensor 13 and the Z-position-detecting sensor 19 are connected to the I/O port 42 through an X-position measuring circuit 47a, a Y-position-measuring circuit 47b and a Z-position-measuring circuit 47c included in a position-measuring circuit 47.

The light source 20 is connected through a laser light emission control circuit 48 to the I/O port 42. The photosensor 29 is connected through an amplifier 49 to the I/O port 42. The coil 25b of the solenoid device 25 is connected through a vibration control circuit 50 to the I/O port 42. The position-detecting sensor 26 is connected through an amplifier 53 and an objective-lens-position-detecting circuit 52 to the I/O port 42. The CCD camera 31, an image processing circuit 54 and a display 55, such as a CRT or a liquid crystal display, are connected to the I/O port 42.

Figure 3:
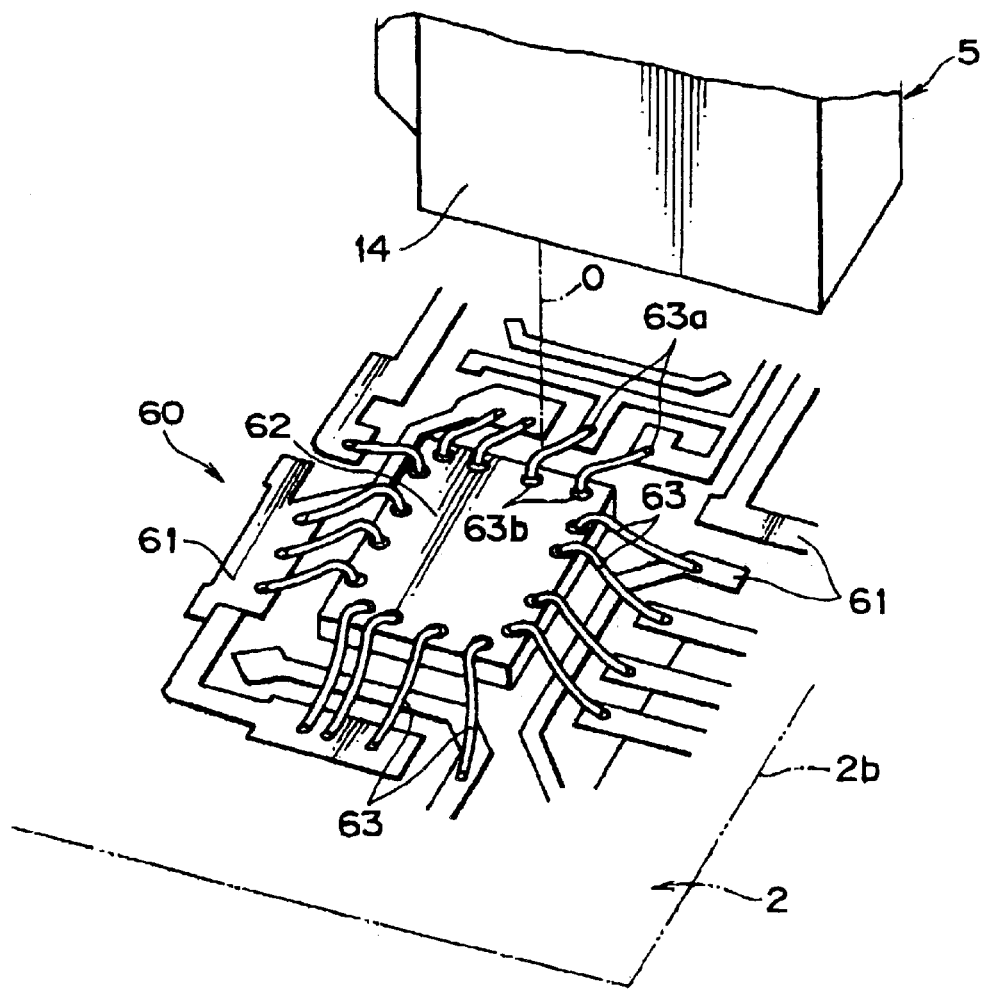
FIG. 3 is an enlarged perspective view of an essential portion of FIG. 1 showing the relation between the height-measuring apparatus and a object to be measured.

In FIG. 3, a reference character 60 denotes the object to be measured mounted on the Y table 2b. The object 60 includes lead frames 61, an IC chip 62 disposed on the lead frames 61, and bonding wires (test parts) 63 connecting the lead frames 61 to the IC chip 62. A reference character 63a denotes bond parts of the bonding wires 63 to the lead frames 61, respectively, and a reference character 63b denotes ball-shaped bond parts of the bonding wires 63 to the IC chip 62, respectively.

<Operations>

Operations of the height-measuring apparatus having the above-mentioned constitution will be described hereinafter.

When measuring the height of a portion of the bonding wire 63 of the object 60 corresponding to a side edge of the IC chip 62, the object 60 is mounted on the Y table 2b of the X-Y table 2.

In such a state, the height-measuring apparatus is connected to a power source to actuate the arithmetic control circuit 40. The controller 45 of the arithmetic control circuit 40 controls the operations of the I/O port 42, the ROM 43 and the RAM 44 according to programs stored in the ROM 43.

The arithmetic control circuit 40 makes the laser light emission control circuit 48 turn on the light source 20 to emit a measurement light flux, such as laser light. The measurement light flux travels through the semitransparent mirrors 27 and 30. Rays of the measurement light flux are collimated into collimated measurement light flux by the collimation lens 21, the collimated measurement light flux travels through the objective lens 22 and falls on the object 60 mounted on the X-Y table 2 to illuminate the object 60.

Figure 11:
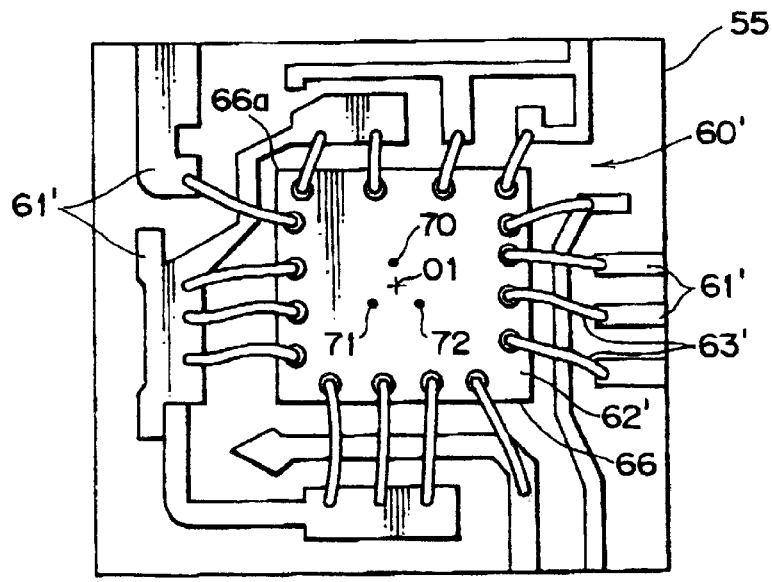
FIG. 11 is an explanatory view showing a displayed example of a measuring object formed by a CCD camera.
Figure 12:
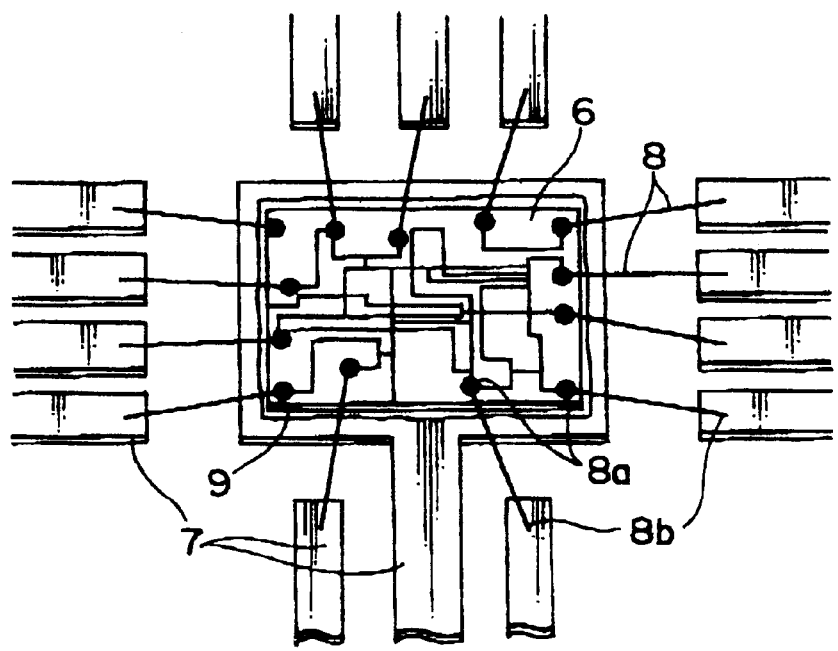
FIG. 12 is an explanatory view showing the relation among known lead frames, an IC chip and bonding wires.

Referring to FIG. 4, the object 60 is illuminated with the measurement light flux emitted. The object 60 reflects the measurement light flux, and the reflected measurement light travels through the objective lens 22, the collimation lens 21, the semitransparent mirror 30 of the photographing optical system and falls on the CCD camera 31. The CCD camera 31 forms an image of the object 60 and gives an image signal representing the image of the object 60 to the arithmetic control circuit 40. The arithmetic control circuit 40 makes the display 55 display an object image 60' of the object 60 as shown in FIG. 11. Shown in FIG. 11 are a lead frame image 61', an IC chip image 62' and a bonding wire image (test part image) 63'.

When a measurement start switch, not shown, is turned on, the arithmetic unit 41 determines X-Y coordinate data including contour data on the contour (shape) 66 of the IC chip image 62' and contour data on the lead frame image 63' and position data (X-Y coordinate data) on the contour 66 of the bonding wire image 63', and permits those data to be stored in the RAM 44.

The RAM 44 is a nonvolatile, rewritable memory, such as a flash memory. Shape data, dimension data and the like on the IC chip 62 are stored in the RAM 44. The arithmetic control circuit 40 determines the contour data on the contour (shape) 66 of the IC chip image 62', the contour data on the lead frame image 61' and the position data on the contour 66 of the bonding wire image 63', and permits those data to be stored in the RAM 44, and compares those data with the shape data, the dimension data and the like on the IC chip 62 stored in the ROM 43 to discriminate the contour data on the contour 66 of the IC chip image 62' from other data.

With the above-mentioned discrimination, the arithmetic control circuit 40 sets a trajectory or a path along which the measurement optical axis O of the measurement light flux emitted from the light source 20, i.e., the optical axis of the objective lens 22 of the measurement light flux projecting optical system, is to be moved on the object 60 in the contour data (plane shape data) of the contour (shape) 66 of the IC chip image 62', and sets a measurement starting point at the upper left-hand corner 66a of the contour 66.

Subsequently, the arithmetic control circuit 40 operates and controls the motors 6 and 10 through the motor driving circuits 46a and 46b to move the measurement optical axis O sequentially to three surface height-measuring points 70, 71 and 72 (predetermined points stored in the RAM 44) for measuring the height of the surface of the IC chip 62 in a middle region of the contour (shape) 66 shown in FIG. 11. These three height-measuring points 70, 71 and 72 are located at a predetermined distance from the center $O_1$ of the contour (shape) 66 and in a region inside the positions of the bonding wires on the IC chip 62. The three height-measuring points 70, 71 and 72 are arranged at angular intervals of 120°.

The three height-measuring points may be at optional positions on the upper surface of the IC chip 62.

The optical axis of the measurement light flux (illuminating light) emitted by the light source 20 is on the upper surface 62a of the IC chip 62 at the height-measuring points 70, 71 and 72. Part of the reflected measurement light flux from the upper surface travels through the objective lens 22, the collimation lens 21 and the semitransparent mirror 30, is reflected by the semitransparent mirror 27 toward the pinhole plate 28 and falls on the photosensor 29.

In this state, the arithmetic control circuit 40 operates and controls the motor 17 through the motor driving circuit 46c to move the optical unit 5 vertically above the height-measuring points 70, 71 and 72 to focus the objective lens 22 on the upper surface 62a of the IC chip 62, thereby forming a spot beam of a predetermined diameter dependent on the light source 20 on the upper surface 62a of the IC chip 62.

In this time, Z position signal provided by the Z position sensor 19 is transferred through the Z position measuring circuit 47c to the arithmetic control circuit 40. The arithmetic control circuit 40 determines the height of the optical unit 5 in the Z direction on the basis of the Z position signal. A pinhole plate may be disposed close to the light source 20 to define the diameter of the spot beam.

When the optical unit 5 is set with the objective lens 22 focused on the upper surface 62a of the IC chip 62, the upper surface 62a of the IC chip 62 and the pinhole plate 28 are conjugate with each other, and the light quantity of the reflected measurement light flux on the photosensor 29 reaches a maximum. The arithmetic control circuit 40 determines the height of the optical unit 5 in the Z direction from the height-measuring points 70, 71 and 72 where the light quantity of the reflected measurement light flux on the photosensor 29 reaches a maximum and permits the obtained height to be stored in the RAM 44. The arithmetic control unit 40 determines the inclination of the upper surface 62a of the IC chip 62 on the basis of the height (position) of the optical unit 5 in the Z direction from the height-measuring points 70, 71 and 72. Then the arithmetic control unit 40 determines vertical (Z direction) position data (Z-coordinate data) on the position of the contour 66 on the basis of inclination data on the inclination of the upper surface 62a and X-Y contour data (plane shape data) of the contour 66 in the X-Y direction, and permits three-dimensional position data on the position of the contour 66 to be stored in the RAM 44.

After thus determining the three-dimensional position data on the contour 66 of the IC chip 62, the arithmetic control unit 40 operates and controls the motors 6 and 10 through the motor driving circuits 46a and 46b to position the optical unit 5 such that the measurement optical axis O coincides with, for example, the upper left-hand corner of the contour (shape) 66. The upper left-hand corner 66a is used as the measurement starting point.

Bonding wires 63 are curved in upward convex curves. Supposing that the wire center of the bonding wires 63 corresponding to side edges of the IC chip 62 is $O_2$, the mean height between the upper surface 62a of the IC chip 62 and the wire center $O_2$ is h, and the height between the upper surface 62a of the IC chip 62 and the objective lens 22 of the optical unit 5 is H, the arithmetic control unit 40 determines the height H of the objective lens 22 to meet the following conditions.

The arithmetic control circuit 40 operates and controls the motor 17 through the motor driving circuit 46c taking into consideration the diameter (or radius) and the height h of the bonding wires 63 to move the optical unit 5 vertically at a high speed, and determines the height H of the objective lens 22 as a reference height $H_0$ at which a focal point f of the objective lens 22 on the side of the object to be measured can be made to coincide approximately with the highest point 63t on the contour 66 of the bonding wire 63. The height H of the objective lens 22 varies as the objective lens 22 is vibrated vertically. In a state shown in FIG. 7, the height H of the objective lens 22 is equal to the reference height $H_0$.

After the height H has been determined, the arithmetic control circuit 40 controls the vibration control circuit (vibration generating circuit) 50 to apply to the coil 25b of the solenoid 25 a high-frequency ac voltage of a frequency on the order of, for example, 1400 Hz/sec. Consequently, the actuator 25a of the solenoid 25 is vibrated at a high frequency to vibrate the prongs 24a of the tuning fork 24 at a high frequency of 1400 Hz/sec, and the objective lens 22 connected to the prong 24a is vibrated vertically at a high frequency of 1400 Hz/sec, thereby starting a vibratory focusing operation.

In this time, the position sensor (sensor for measuring the height of the objective lens 22) 26 provides a Z direction position signal. The Z direction position signal is transferred through the amplifier 53 and the objective lens position detecting circuit 52 to the arithmetic control circuit 40.

Subsequently, the arithmetic control circuit 40 controls the motor driving circuits 46a and 46b to operate the motors 6 and 10 so that the measurement optical axis O is moved from the measurement starting point 66a so as to move, for example, clockwise along the contour (shape) 66, i.e., the path, at a low moving speed on the order of, for example, 3 mm/s and is returned to the measurement starting point 66a.

When the measurement optical axis O and the measurement light crosses the contour 66 of the bonding wire 63 while the measurement optical axis O is moved and the objective lens 22 is vibrated at a high frequency, a spot light of the measurement light flux emitted by the light source 20 is illuminated on the bonding wire 63. Part of the reflected measurement light flux from the bonding wire 63 travels through the objective lens 22, the collimation lens 21 and the semitransparent mirror 30, is reflected by the semitransparent mirror 27 toward the pinhole 28 and falls on the photosensor 29. Then, the photosensor 29 gives a light quantity signal to the arithmetic control circuit 40.

Figure 8:
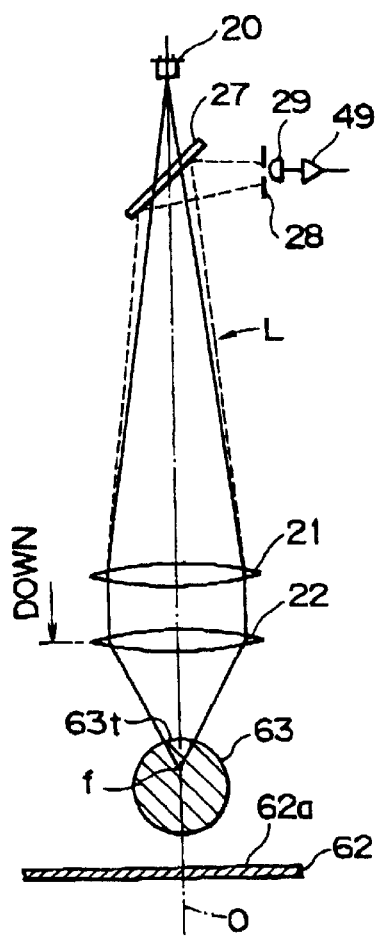
FIG. 8 is a diagrammatic view of assistance in explaining operations of the measurement optical system shown in FIG. 4.
Figure 9:
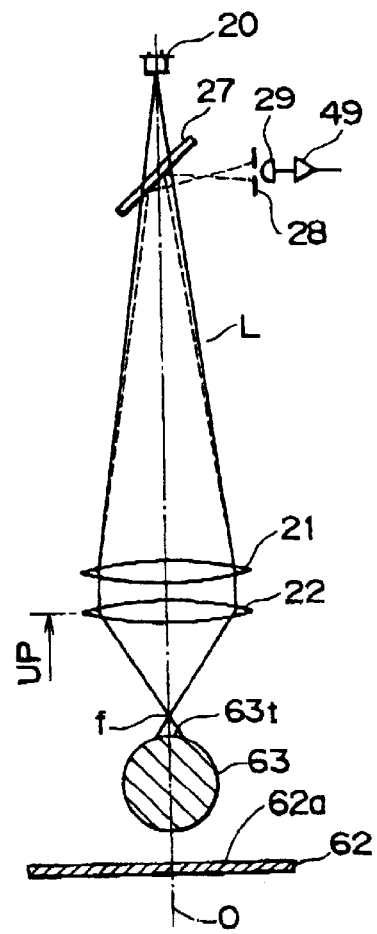
FIG. 9 is a diagrammatic view of assistance in explaining operations of the measurement optical system shown in FIG. 4.

If the focal point f of the objective lens 22 is located below the highest point (upper surface) 63t on the bonding wire 63 as shown in FIG. 8 or above the same as shown in FIG. 9, the highest point 63t on the bonding wire 63 and the pinhole 28 are not conjugate with each other. An image of the reflected light from the highest point 63t on which the spot light (measurement light) falls is formed at a position behind the photosensor 29 when the focal point f of the objective lens 22 is located below the highest point 63t on the bonding wire 63 as shown in FIG. 8. An image of the reflected light from the highest point 63t on which the spot light (measurement light) falls is formed at a position in front of the photosensor 29 when the focal point f of the objective leans 22 is located above the highest point 63t on the bonding wire 63 as shown in FIG. 9. In those states, the light quantity of the reflected measurement light flux fallen on the photosensor 29 is lower than the maximum.

Figure 7:
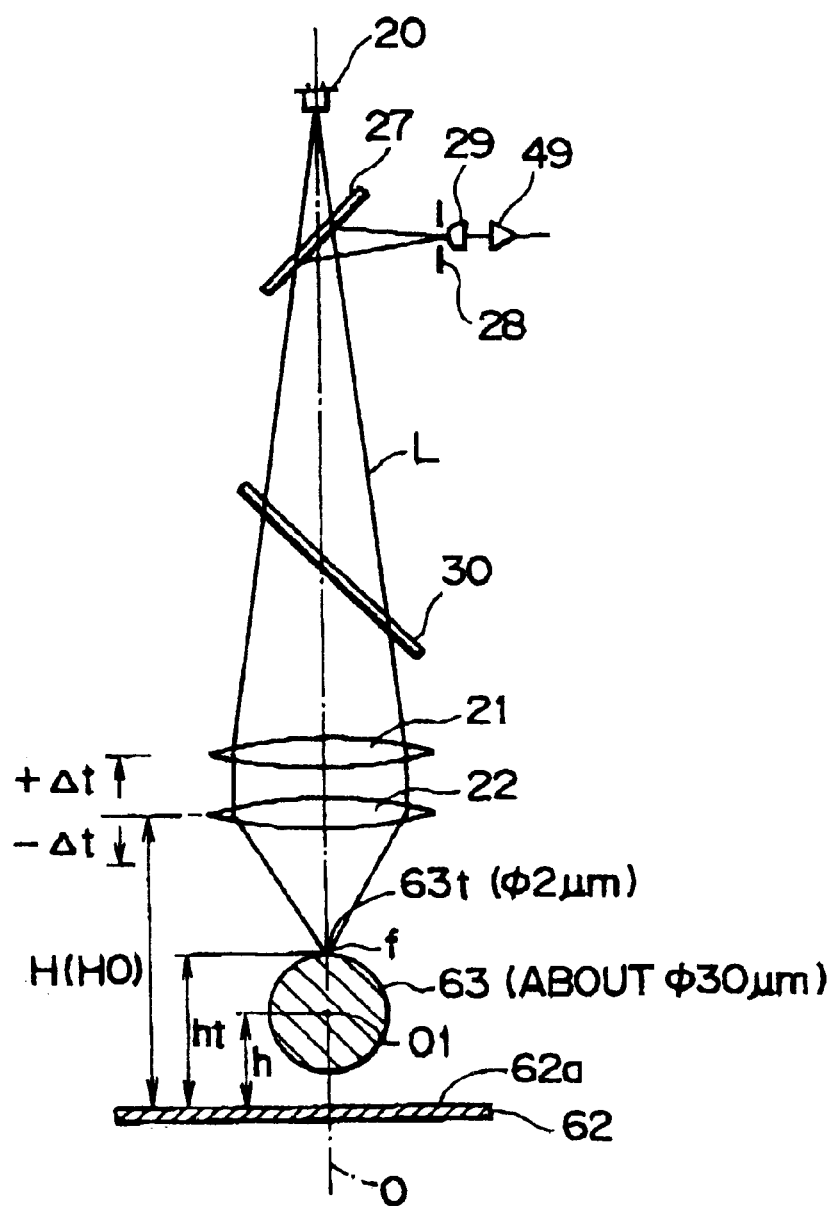
FIG. 7 is a diagrammatic view of assistance in explaining operations of the measurement optical system shown in FIG. 4.

An image of the spot beam of the measurement light flux on the bonding wire 63 is formed on the photosensor 29 when the focal point f of the objective lens 22 coincides with the highest point 63t on the bonding wire 63 as shown in FIG. 7 and the highest point 63t on the bonding wire 63 and the pinhole plate 28 are conjugate with each other. Consequently, the light quantity of the reflected measurement light flux on the photosensor 29 increases to the maximum and a detection signal of the light quantity outputted from the photosensor 29 increases to the maximum.

Upon the increase of the level of the light quantity detection signal provided by the photosensor 29 to a.peak level, i.e., upon the start of decrease of the level of the light quantity detection signal from the peak level, the arithmetic control circuit 40 allows the RAM 44 to store the maximum level values of the Z direction position signal representing the position of the objective lens 22 at the moment when the level of the light quantity detection signal started to decrease as vertical lens displacement Δt from the reference height $H_0$.

The arithmetic control circuit 40 processes the data stored in the RAM 44 including the lens displacement Δt, the reference height $H_0$, the Z direction height of the objective lens 22 of the optical unit 5, the three-dimensional coordinates defining the contour 66 and the position of the measurement optical axis O in the contour in the profile 66 in an X-Y coordinate system to determine the height H of the objective lens 22 and permits the height H to be stored in the RAM 44. The arithmetic control circuit 40 determines the height $h_t$ of the highest point 63t on the bonding wire 63 on the basis of the height H of the objective lens 22 and the focal length of the objective lens 22 and stores the same in the RAM 44. The arithmetic control circuit 40 determines a height h of the wire center $O_1$ of the highest point of the bonding wire 63 on the basis of the height $h_t$ and the diameter (or radius) of the bonding wire 63 and permits the obtained height h to be stored in the RAM 44.

The arithmetic control circuit 40 permits the height h and the X-Y coordinates of the measurement optical axis O on the contour 66 in combination to be stored in the RAM 44. The display 55 displays the respective heights of the highest points on the bonding wires 63 thus determined on its screen in bars ①, ②, ③, ④ . . . in FIG. 10.

Figure 10:
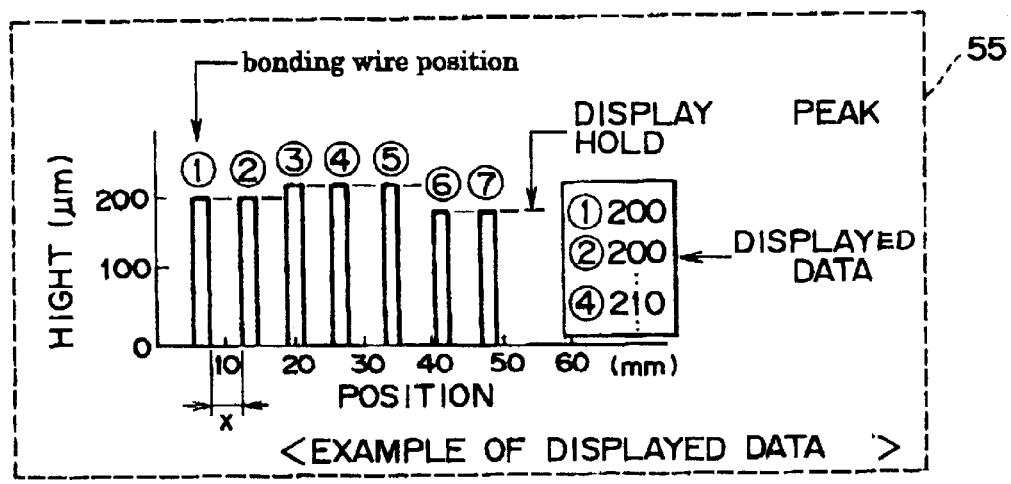
FIG. 10 is an explanatory view showing a displayed example on measurements to a display shown in FIG. 6.

The arithmetic control circuit 40 measures the X-Y coordinates of the bonding wires 63 on the contour 66 and the heights of the bonding wires 63 while the measurement optical axis O is moved from the measurement starting point 66a so as to move, for example, clockwise along the contour (shape) 66, i.e., the path (trajectory), and is returned to the measurement starting point 66a to determine intervals x between the adjacent bonding wires 63. The intervals x also are displayed on the display 55 as shown in FIG. 10, in which only the interval x between the bars ① and ② is shown by way of example.

EXAMPLES (1) Specification

Bonding Wire Height-measuring Apparatus

Diameter of laser spot beam emitted from the light source 20: 2.0 μm

Vertical measuring range: ±0.3 mm
 (Range of vertical vibration of the objective lens 22)
 Vibrating frequency of the objective lens 22 by the tuning fork: 1400 Hz/sec
 (Focusing cycles)

Moving speed of X-Y table: 3 mm/s

Data on Bonding Wires 63

Height of the Bonding Wire 63: 200 μm (Reference height) ±10 μm (±5%)
 (Height of the highest point on the bonding wire 63 from the upper surface of the IC chip 62).

Diameter of the Bonding Wire: 30 μm (2) Measurements

The bonding wires 63 of 30 μm in diameter were scanned with the measurement light flux by moving the measurement optical axis O at 3 mm/s and vertically vibrating the objective lens 22 at a frequency of 1400 Hz/sec so that the measurement optical axis O moved across the bonding wires 63. The photosensor 29 recieved the reflected measurement light flux in the range of eight to fourteen times for each bonding wire 63.

The objective lens 22 was set at the measurement starting point with its focal point on the side of the object to be measured 60 located at a height of 200 μm from the upper surface of the IC chip 62. The respective measured heights of the bonding wires 63 were measured in the range of 200±10 μm (±5%).

When the focusing operation of a spot beam (measurement light) on the bonding wire was repeated at least eight times while the measurement light flux is crossing each bonding wire 63, a condition where the photosensor 29 and the bonding wire 63 are conjugate with each other could be created and the light quantity of the reflected measurement light flux on the photosensor 29 reflected from the bonding wire 63 reached a level above a predetermined level and the heights of the bonding wires 63 could satisfactorily be measured.

<Modifications>

Means for holding the objective lens 22 for vertical vibration is not limited to the tuning fork 24. For example, a lens barrel, not shown, containing the objective lens 22 may be supported for vertical vibration by a coil spring or the like at the middle point of the range of vibration and may be vibrated by electromagnetic force created by conduction to a coil. It is also possible to vibrate the lens barrel vertically by an ultrasonic vibrating means. In this case, a sensor similar to the position sensor 26 may be attached to the lens barrel.

The position sensor 26 may be an optical sensor that projects a measurement light flux obliquely on the lower prong 24a, receives the measurement light flux reflected from the prong 24a by a light receiving means, such as a line sensor or an area sensor using CCD, and determines the vertical position of the prong 24a on the basis of the position of the reflected measurement light flux on the light receiving means. Furthermore, an actuating coil or a linear sensor may be employed as the position sensor 26.

Although the object to be measured including the lead frames 61, the IC chip 62 and the bonding wires 63 which are tests parts is operated and controlled in the X and the Y directions by the X-Y table 2, the present embodiments are not necessarily limited to such a constitution. For example, the object to be measured including the lead frames 61, the IC chip 62 and the bonding wires 63 may be mounted on a fixed X-Y table and the optical unit 5 may be supported on the column 3 so as to be moved in a three-dimensional direction of X, Y and the Z by a three-dimensional driving mechanism to measure the respective heights of the bonding wires 63.

The trajectory along which the measurement optical axis O is moved relative to the object to be measured may be determined by the operator by operating the switches and keys of a keyboard, not shown, watching a picture displayed on the display 55, by using trajectory setting means, such as buttons on a control panel, or by a trajectory setting means, such as a mouse or a light pen. When the trajectory setting means is used, the peripheral shape of the IC chip 62 can be used as the trajectory by specifying the positions (coordinates) of the corners of the IC chip 62 to define the peripheral shape of the IC chip 62.

If the object 60 is set accurately on the X-Y table 2, the magnification of an image formed by the CCD camera 31 for photographing the object 60 on the table is fixed and the dimensions (size) and the shape of the object 60 are known, the data on the trajectory along which the measurment optical axis O is moved relative to the object 60 may be stored beforehand in the ROM 43, and the measurement optical axis O may be moved along the trajectory defined by the data stored in the ROM 43 (along the periphery of the IC chip 62). In this case, the X-Y table 2 may be operated with the measurment light flux projected on the object 60 so as to locate the spot beam of the measurment light flux at one of the corners of the IC chip 62, for example, at the upper left-hand corner, whereby the measurment optical axis O of the measurment light flux may be moved clockwise or counterclockwise along the periphery of the IC chip 62 form the measurment starting point so as to return to the measurment starting point to measure the respective heights of the bonding wire 63.

If the highest points on the bonding wires 63 correspond to positions in an error range including predetermined positions on the inside or the outside of the periphery of the IC chip 62, a trajectory corresponding to the highest points is determined beforehand and the measurement optical axis O may be moved along the trajectory.

As apparent from the foregoing description, the height-measuring method and the height-measuring apparatus according to the present invention are capable of instantly deciding whether or not the intervals between the bonding wires 63 and the respective heights of the bonding wires 63 from the upper surface of the IC chip are within a specified range of interval and a specified range of height, respectively. Since IC chips not meeting specified wiring conditions can be discriminated from those meeting specified wiring conditions, IC chips not meeting the specified wiring conditions can easily be eliminated before being delivered to the next process. Thus, occurrence of defective products (defective ratio) can be reduced.

The invention being thus described, it will be apparent that the same may be varied in many ways. Such variations are not to be regarded as a departure form the spirit and scope of the invention, and all such modifications as would be recognized by one skilled in the art are intended to be included within the scope of the following claims.

What is claimed is:

1. A method for measuring a height of a test part of an object to be measured, said method comprising the steps of:
    placing said object on a table;
    projecting a spot beam of a measurement light flux to said object on said table from an upper direction of said object, said measurement light flux being emitted by a light source and focused into the spot beam by an optical member for focusing;
    receiving a reflected light of the spot beam reflected by said object with a photosensor to detect a focused state of said measurement light flux on said object;
    receiving said reflected light of the spot beam by a camera;
    forming, with said camera, an image of said object using said reflected light;
    determining X-Y coordinate data for said image including contour data on a contour of said image;
    setting a trajectory along which the optical axis is to be moved in said contour data of said image;
    driving said light source and said optical member relatively to said table in a way of scanning in a horizontal direction such that said measurement light flux moves along a periphery of said object while reciprocating said optical member vertically at a high speed; and
    determining said height of said test part on the basis of a vertical position of said optical member when said measurement light flux is focused on said test part by said optical member.

2. The method according to claim 1, wherein said object comprises a lead frame, an IC chip, and a bonding wire as said test part for electrically connecting the lead frame to the IC chip.

3. The method according to claim 1, wherein said step of setting a trajectory includes setting a measurement starting point, and said step of driving includes moving said measurement light flux from said measurement starting point, around said periphery, and returning to said measurement starting point.

4. An apparatus for measuring a height of a test part of an object to be measured, said apparatus comprising:
    a table on which the object is placed;
    a light source for emitting a light flux for measurement;
    a first optical system including an optical member for focusing, the optical member being capable of being moved along an optical axis of the light flux, said first optical system focusing the light flux from said light source into a spot beam to irradiate the object on said table;
    means for reciprocating the optical member along the optical axis within a predetermined range at a high speed to focus the optical member on the object;
    a first sensor for detecting a position of the optical member along the optical axis;
    a second sensor for receiving a reflected light of the light flux from the object;
    a camera unit for receiving the reflected light of the light flux from the object and forming an image of the object;
    a second optical system for guiding the reflected light to the second sensor through the optical member;
    a case for housing said light source, said first optical system, said second sensor and said second optical system;
    means for moving the optical axis relatively to the object by moving said case and the object relatively to each other at least in a horizontal direction; and
    an arithmetic control circuit for determining the height of said first optical system when the light flux is focused on the test part on the basis of a first detection signal output by said first sensor, said circuit determining the height when said circuit judged said first optical system to be focused on the object, said arithmetic control circuit receiving an image signal of said image from said camera unit and, based on said image, controlling said means for moving the optical axis such that the light flux is moved along a periphery of said object.

5. The apparatus according to claim 4, wherein said optical member is an objective lens.

6. The apparatus according to claim 5, wherein said means for moving the optical axis comprises a tuning fork having a pair of prongs and a solenoid device for driving the tuning fork to vibrate, said optical member being attached to one prong of said tuning fork and said solenoid device being attached to the other prong of said tuning fork.

7. The apparatus according to claim 6, wherein said optical member is vibrated at a frequency of approximately 1400 Hz.

8. The apparatus according to claim 6, wherein said first sensor is an optical range finder for measuring a height of one of said prongs of said tuning fork.

9. The apparatus according to claim 4, wherein the object comprises a lead frame, an IC chip, and a bonding wire as the test part electrically connecting the IC chip to the lead frame.

10. A method for measuring a height of a test part of an object to be measured, said method comprising the steps of:
    placing said object on a table;
    projecting a spot beam of a measurement light flux along an optical axis to said object on said table, said measurement light flux being emitted by a light source and focused into the spot beam by an optical member;
    receiving a reflected light of the spot beam reflected by said object with a photosensor and with a camera, said photosensor detecting a focused state of said measurement light flux on said object, and said camera forming an image of said object;

setting a trajectory including a measurement starting point for moving said optical axis based on a contour of said image;

moving said optical axis relative to said object at least in a horizontal direction such that said measurement light flux moves, beginning from said measurement starting point, along a periphery of said object to return to said measurement starting point, while reciprocating said optical member vertically at a high speed; and determining said height of said test part on the basis of a vertical position of said optical member when said measurement light flux is focused on said test part by said optical member.

11. The method according to claim 10 wherein said optical axis is moved along the periphery at approximately 3 mm/second.

12. The method according to claim 10, wherein said optical member is vibrated at a frequency of approximately 1400 Hz.

* * * * *